(12) United States Patent
Jeong

(10) Patent No.: US 7,838,435 B2
(45) Date of Patent: Nov. 23, 2010

(54) METHOD FOR FORMING SEMICONDUCTOR FINE-PITCH PATTERN

(75) Inventor: Eun Soo Jeong, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 377 days.

(21) Appl. No.: 12/121,967

(22) Filed: May 16, 2008

(65) Prior Publication Data
US 2008/0286973 A1    Nov. 20, 2008

(30) Foreign Application Priority Data
May 18, 2007    (KR)    .................. 10-2007-0048577

(51) Int. Cl.
*H01L 21/308*    (2006.01)
(52) U.S. Cl. .............. 438/734; 430/314; 438/700; 257/E21.026; 257/E21.034
(58) Field of Classification Search .......... 438/700, 438/734; 430/314; 257/E21.026, E21.035
See application file for complete search history.

(56) References Cited

U.S. PATENT DOCUMENTS

| | | | |
|---|---|---|---|
| 5,328,810 A * | 7/1994 | Lowrey et al. | 430/313 |
| 6,316,168 B1 * | 11/2001 | Butt et al. | 430/314 |
| 6,429,123 B1 * | 8/2002 | Tseng | 438/642 |
| 7,253,113 B2 * | 8/2007 | Cheng | 438/703 |
| 7,732,338 B2 * | 6/2010 | Narita | 438/702 |
| 7,736,980 B2 * | 6/2010 | Juengling | 438/270 |
| 2003/0091936 A1 * | 5/2003 | Rottstegge et al. | 430/312 |

FOREIGN PATENT DOCUMENTS

| | | |
|---|---|---|
| KR | 1998-026093 A | 7/1998 |
| KR | 10-2005-0002513 A | 6/2003 |

OTHER PUBLICATIONS

Office Action issued from the Korean Patent Office on Aug. 18, 2008, in related Korean patent application No. 10-2007-0048577.

* cited by examiner

*Primary Examiner*—Fernando L Toledo
(74) *Attorney, Agent, or Firm*—Finnegan, Henderson, Farabow, Garrett & Dunner, L.L.P.

(57) ABSTRACT

A method for forming a fine-pitch pattern on a semiconductor substrate is provided. The method includes patterning the semiconductor substrate to form a plurality of fine lines, forming a thermal oxide layer on the fine lines, polishing the thermal oxide layer to expose a top surface of the fine lines; etching the fine lines using the thermal oxide layer as a mask to expose first portions of the semiconductor substrate, etching a central bottom portion of the thermal oxide layer to expose second portions of the semiconductor substrate, and etching the semiconductor substrate using the etched thermal oxide layer as a mask.

14 Claims, 3 Drawing Sheets

METHOD FOR FORMING SEMICONDUCTOR FINE-PITCH PATTERN

RELATED APPLICATION

This application claims the benefit of priority to Korean patent application no. 10-2007-0048577, filed on May 18, 2007, the entire contents of which are incorporated herein by reference.

TECHNICAL FIELD

Embodiments consistent with the present invention relate to a method for forming a semiconductor pattern, and more particularly, to a method for forming a semiconductor fine-pitch pattern in a semiconductor photolithography process.

RELATED ART

The minimum line width that a photolithography process can produce is generally determined by the light source used. Currently, it is difficult to realize a line width of several nanometers (nms) due to the limitations of optical systems and the limitations of the resolution of photoresist polymers.

SUMMARY

Embodiments consistent with the present invention may provide a method for forming a fine-pitch pattern on a semiconductor substrate. The method may be capable of forming a silicon fine-pitch pattern having a minimum line width on a silicon bare wafer to realize half of the line width of a conventional photolithography process.

In accordance with an embodiment consistent with the present invention, there is provided a method for forming a fine-pitch pattern on a semiconductor substrate. The method includes patterning the semiconductor substrate to form a plurality of fine lines, forming a thermal oxide layer on the fine lines, polishing the thermal oxide layer to expose a top surface of the fine lines; etching the fine lines using the thermal oxide layer as a mask to expose first portions of the semiconductor substrate, etching a central bottom portion of the thermal oxide layer to expose second portions of the semiconductor substrate, and etching the semiconductor substrate using the etched thermal oxide layer as a mask.

DETAILED DESCRIPTION

Hereinafter, embodiments consistent with the present invention will be described in detail with reference to the accompanying drawings so that they can be readily implemented by those skilled in the art.

FIGS. 1A to 1J are sectional views illustrating a process for forming a semiconductor fine-pitch pattern according to one embodiment consistent with the present invention.

Figure 1A:
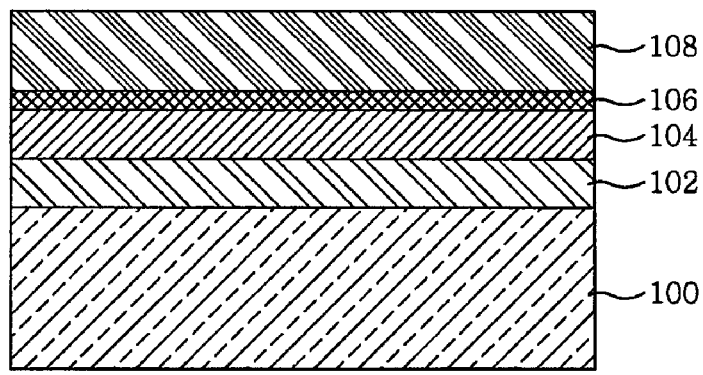
FIGS. 1A to 1J are sectional views illustrating a method for forming a semiconductor fine-pitch pattern according to embodiments consistent with the present invention.

Referring to FIG. 1A, a nitride layer 102, which may be a hard mask, is formed on a semiconductor substrate 100 and a patterning auxiliary layer 104, which may comprise tetraethyl orthosilicate (TEOS), is formed on nitride layer 102. In one embodiment, nitride layer 102 may be formed to have a thickness of about 1,000 Å or more, using a low pressure chemical vapor deposition (LPCVD) process, and patterning auxiliary layer 104 may be formed to have a thickness of about 1,000 Å or more.

After forming patterning auxiliary layer 104, a reflection preventing layer 106 and a photoresist 108 are formed on patterning auxiliary layer 104. Reflection preventing layer 106, which may act as a bottom anti-reflective coating (BARC) layer, may have a thickness of about 500 Å or more, and photoresist 108 may have a thickness of about 4,000 Å or more.

Figure 1B:
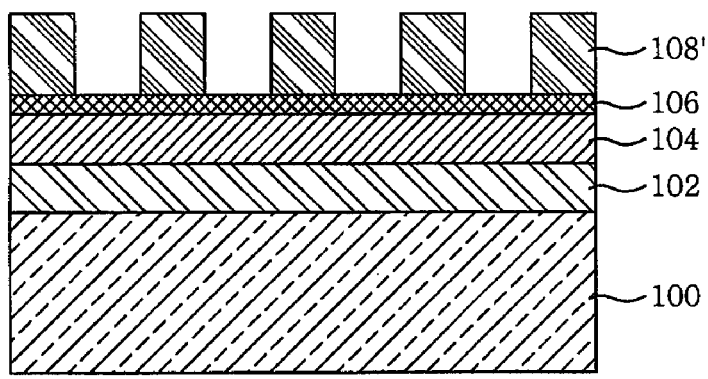
Figure 1C:
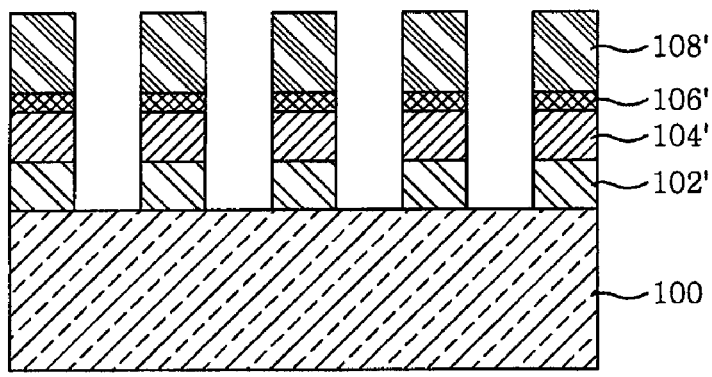

Referring to FIGS. 1B and 1C, a photolithography process may be performed to pattern photoresist 108, such that a photoresist dense line 108' is formed. In one embodiment, photoresist dense line 108' may have a minimum line with of about 90 nm or less.

Further, after patterning photoresist 108 as illustrated in FIG. 1B, reflection preventing layer 106, patterning auxiliary layer 104, and nitride layer 102 may be sequentially etched or patterned using a reactive ion etching (RIE) process. In FIGS. 1B and 1C, reference numerals 102', 104', 106', and 108' respectively denote a nitride layer, a patterning auxiliary layer, a reflection preventing layer, and a photoresist after being patterned using the RIE process. Consistent with embodiments of the present invention, other suitable patterning processes may be used.

Figure 1D:
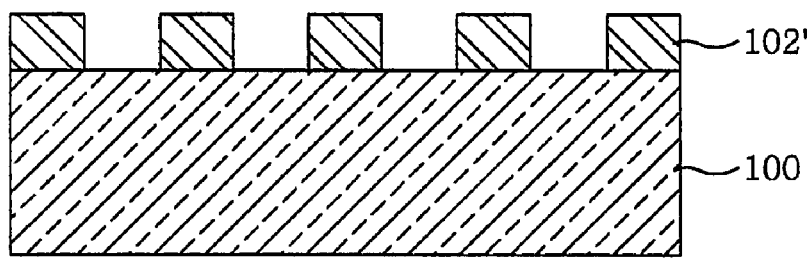

Referring to FIG. 1D, photoresist 108', reflection preventing layer 106', and patterning auxiliary layer 104' may be removed using a wet cleaning process. As a result, only patterned nitride layer 102' remains on semiconductor substrate 100.

Figure 1E:
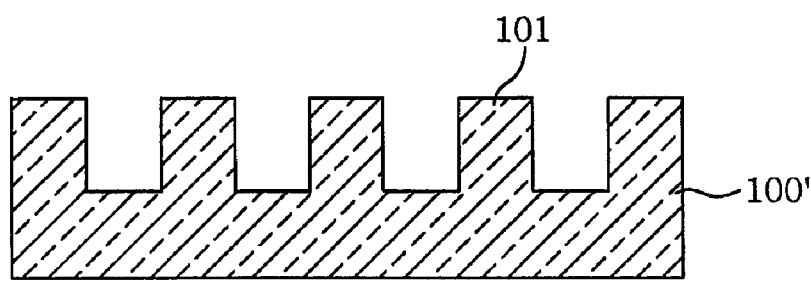

Referring to FIG. 1E, after etching semiconductor substrate 100 using nitride layer 102' as a hard mask, nitride layer 102' is removed and a patterned semiconductor substrate 100' including fine lines 101 is formed. In one embodiment, semiconductor substrate 100 may be etched by the above-described RIE process, and nitride layer 102' may be removed by the above-described wet cleaning process. Other suitable patterning processes may also be used consistent with the present invention.

Figure 1F:
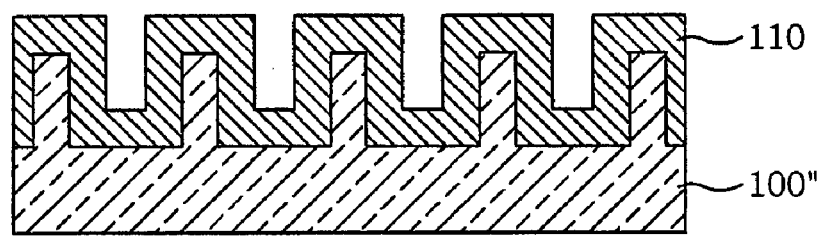

Referring to FIG. 1F, a thermal oxide layer 110 is formed on patterned semiconductor substrate 100' by using, for example, a wet oxidizing process. In one embodiment, thermal oxide layer 110 may comprise silicon oxide, and the wet oxidizing process may be a thermal process performed in a wet atmosphere, so as to oxidize semiconductor substrate 100, which may be made of, for example, silicon. Consistent with embodiments of the present invention, the size of fine lines 101 of semiconductor substrate 100' is reduced by about 35% to about 55% as a result of the oxidizing process. In one embodiment, semiconductor substrate 100' may be oxidized to form thermal oxide layer 110 and the size of file lines 110 of semiconductor substrate 100' will be reduced by about 45%. For example, assuming that, before the wet oxidizing process, the size of fine lines 101 of semiconductor substrate 100' is 100%, the size of fine lines 101 is reduced by about 45% after thermal oxide layer 110 is formed. In FIG. 1F, reference numeral 100" denotes the semiconductor substrate after thermal oxide layer 110 is formed thereon.

Figure 1G:
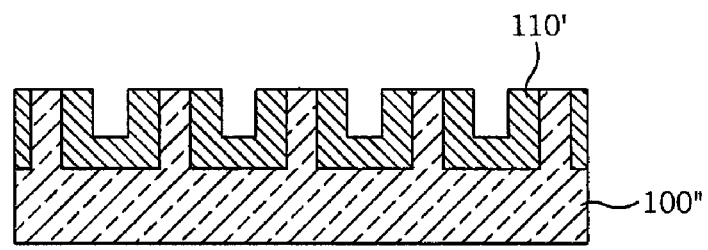

Referring to FIG. 1G, thermal oxide layer 110 may be polished by using a chemical mechanical polishing (CMP) process or other suitable processes, so as to expose a top surface of semiconductor substrate 100". In FIG. 1G, reference numeral 110' denotes a thermal oxide layer after the CMP process.

Figure 1H:
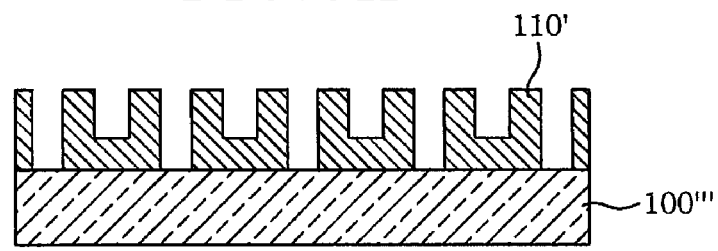

Referring to FIG. 1H, semiconductor substrate 100" is wet etched from the top surface of semiconductor substrate 100" exposed by the CMP process. In FIG. 1H, reference numeral 100''' denotes the semiconductor substrate after being wet etched. As a result, thermal oxide layer 110' having a U-shape structure is formed on an upper surface of semiconductor substrate 100'''.

Due to the etching ratio of semiconductor substrate 100'' and thermal oxide layer 110, semiconductor substrate 100'' may be wet etched using a fluorine (F) based solution. In one embodiment, a fluorinated ethylene propylene (FEP) solution may be used. Here, the FEP may comprise a polymer formed by combining a plurality of ethylene units —$CH_2CH_2$— and a plurality of propylene units —$CH_2CH_2CH_2$—, and by replacing a plurality of hydrogen components by a plurality of F components.

Referring again to FIG. 1H, it is illustrated that only semiconductor substrate 100''' is etched. However, thermal oxide layer 110' may also be finely etched in accordance with the difference in etching ratios. For example, assuming that the etching ratio of silicon (Si) and silicon oxide ($SiO_2$) is Si:$SiO_2$=10:1, semiconductor substrate 100'', which may include Si, is deeply etched to the lower part of fine lines 101, while thermal oxide layer 110', which may include $SiO_2$, is etched only to a part of its surface. The etching ratio of silicon (Si) and silicon oxide ($SiO_2$) may vary in accordance with process conditions. For example, etching ratio Si:$SiO_2$ may be from about 10:1 to about 20:1.

Figure 1I:
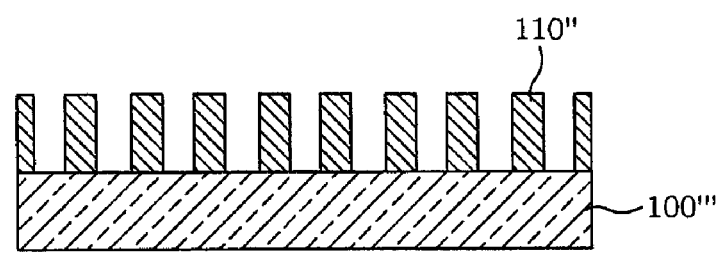

Referring to FIG. 1I, thermal oxide layer 110' is etched at a central bottom portion of its U-shape structure. In one embodiment, thermal oxide layer 110' may be etched using the above-described RIE process, but other suitable patterning methods may be used. In FIG. 1I, reference numeral 110'' denotes the thermal oxide layer after thermal oxide layer 110' is etched.

Figure 1J:
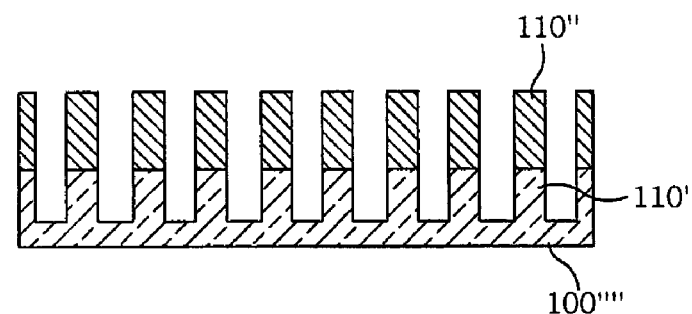

Referring to FIG. 1J, semiconductor substrate 100''' is etched using thermal oxide layer 110'' as a mask to form fine-pitch lines 101' on semiconductor substrate 100'''. In one embodiment, semiconductor substrate 100''' may be etched using the above-described RIE process, but other suitable patterning methods may be used. In FIG. 1J, reference numeral 100'''' denotes the semiconductor substrate after semiconductor substrate 100''' is etched using thermal oxide layer 110'' as a mask.

Accordingly, the method for forming a semiconductor fine-pitch pattern consistent with the present invention may reduce the minimum line width of a silicon fine-pitch pattern on a bare silicon wafer. In contrast to using a conventional nitride layer as a mask, the minimum line width of a silicon fine-pitch pattern may be reduced by 50% by using thermal oxide layer 110'' shown in FIG. 1I as a mask.

While the present invention has been shown and described with respect to one or more embodiments, it will be understood by those skilled in the art that various changes and modifications may be made without departing from the spirit and scope of the appended claims.

What is claimed is:

1. A method for forming a fine-pitch pattern on a semiconductor substrate, comprising:
    patterning the semiconductor substrate to form a plurality of fine lines;
    forming a thermal oxide layer on the fine lines;
    polishing the thermal oxide layer to expose a top surface of the fine lines; etching the fine lines using the thermal oxide layer as a mask to expose first portions of the semiconductor substrate;
    etching a central bottom portion of the thermal oxide layer to expose second portions of the semiconductor substrate; and
    etching the semiconductor substrate using the etched thermal oxide layer as a mask.

2. The method of claim 1, wherein patterning the semiconductor substrate comprises:
    forming a patterned nitride layer on the semiconductor substrate;
    etching the semiconductor substrate using the nitride layer as a mask to form the fine lines; and
    removing the nitride layer.

3. The method of claim 1, wherein forming the thermal oxide layer on the fine lines comprises oxidizing the semiconductor substrate.

4. The method of claim 3, wherein oxidizing the semiconductor substrate reduces a size of the fine lines of the semiconductor substrate by about 35% to about 55%.

5. The method of claim 3, wherein oxidizing the semiconductor substrate comprises oxidizing the semiconductor substrate in a wet atmosphere.

6. The method of claim 1, wherein etching the semiconductor substrate or etching the thermal oxide layer comprises performing a reactive ion etching (RIE) process.

7. The method of claim 1, wherein etching the fine lines comprises removing a portion of the fine lines using an fluorine (F) based solution in accordance with an etching ratio of the thermal oxide layer to the semiconductor substrate.

8. The method of claim 7, wherein the F based solution comprises a fluorinated ethylene propylene (FEP) solution.

9. The method of claim 7, wherein the etching ratio is about 10:1 to about 20:1.

10. The method of claim 8, wherein the FEP solution is formed by combining a plurality of ethylene (—$CH_2CH_2$—) units and a plurality of propylene (—$CH_2CH_2CH_2$—) units and replacing a plurality of hydrogen components with a plurality of fluorine components.

11. The method of claim 2, wherein forming the patterned nitride layer comprises:
    forming a nitride layer on the semiconductor substrate;
    forming a patterning auxiliary layer on the nitride layer;
    forming a reflection preventing layer on the patterning auxiliary layer;
    forming a photoresist layer on the reflection preventing layer;
    patterning the photoresist layer to expose portions of reflection preventing layer;
    patterning the reflection preventing layer, the patterning auxiliary layer, and the nitride layer using the patterned photoresist layer as a mask; and
    removing remaining portions of the reflection preventing layer, the photoresist layer, and the patterning auxiliary layer.

12. The method of claim 11, wherein removing the remaining portions of the reflection preventing layer, the photoresist layer, and the patterning auxiliary layer comprises using a wet cleaning process.

13. The method of claim 11, wherein the patterning auxiliary layer comprises a tetraethyl orthosilicate (TEOS) layer having a thickness of at least 1,000 Å.

14. The method of claim 11, wherein forming the nitride layer comprises forming the nitride layer using a low pressure chemical vapor deposition (LPCVD) process.

* * * * *